(12) United States Patent
Youn et al.

(10) Patent No.: US 7,939,379 B2
(45) Date of Patent: May 10, 2011

(54) HYBRID CARRIER AND A METHOD FOR MAKING THE SAME

(75) Inventors: Sung-Ho Youn, Kyunggi-Do (KR); Hyeong-No Kim, Kyunggi-Do (KR)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 332 days.

(21) Appl. No.: 12/025,824

(22) Filed: Feb. 5, 2008

(65) Prior Publication Data

US 2009/0194858 A1 Aug. 6, 2009

(51) Int. Cl.
*H01L 21/00* (2006.01)
(52) U.S. Cl. ............ 438/123; 257/676; 257/E23.043; 257/E21.502
(58) Field of Classification Search .................. None
See application file for complete search history.

(56) References Cited

U.S. PATENT DOCUMENTS

2006/0255009 A1* 11/2006 Card et al. ............... 216/13
2009/0140415 A1* 6/2009 Furuta ..................... 257/700

FOREIGN PATENT DOCUMENTS

JP         05283859 A   * 10/1993
JP       2004031710 A   *  1/2004

\* cited by examiner

*Primary Examiner* — Matthew S Smith
*Assistant Examiner* — Shaka Scarlett
(74) *Attorney, Agent, or Firm* — Volentine & Whitt, P.L.L.C.

(57) ABSTRACT

A hybrid carrier and a method for making the same, wherein the hybrid carrier has a plurality of interconnection leads, so that a wire bondable semiconductor device or a flip chip die apparatus can be placed on the hybrid carrier, and is electrically connected to die paddle and bond fingers. Also, it is easy to dispose a semiconductor device on the hybrid carrier and easy to electrically bond the hybrid carrier and the semiconductor device. Therefore, the hybrid carrier and the method for making the same can be applied to an area array metal CSP easily, and the method is simple, so the production cost can be reduced.

25 Claims, 5 Drawing Sheets

HYBRID CARRIER AND A METHOD FOR MAKING THE SAME

BACKGROUND OF THE INVENTION

1. Field of the Invention

The invention relates to a carrier and a method for making the same, particularly to a hybrid carrier having an interposer and a method for making the same.

2. Description of the Related Art

FIG. 1 shows a conventional leadframe. The conventional leadframe 1 comprises a die pad 101, a frame 102, a plurality of leads 103 and a plurality of tie bars 104. The leads 103 are disposed around the die pad 101. The tie bars 104 are used to fix the die pad 101 at the center portion of the conventional leadframe 1. In applications, a semiconductor device (not shown) is disposed on the die pad 101, and a plurality of conductive wires (not shown) are used to electrically connect the semiconductor device and the leads 103, to form a package. Since the conventional leadframe 1 has few leads 103, the conventional leadframe 1 has insufficient electrical contacts. Therefore, the package with the conventional leadframe 1 has less inputs and outputs, so additional functions of the package could not be added.

Consequently, there is an existing need for providing a hybrid carrier and a method for making the same to solve the above-mentioned problems.

SUMMARY OF THE INVENTION

The present invention provides a hybrid carrier. The hybrid carrier comprises a dielectric layer and a central metal layer. The dielectric layer has a first surface, a second surface, a first area and a second area. The second surface corresponds to the first surface. The first area is at the central portion of the dielectric layer and the second area is around the first area. The first area has at least one first opening and the second area has a plurality of second openings. The central metal layer covers the first opening and the second openings, and exposes parts of the dielectric layer by both sides of the first surface and the second surface. The central metal layer comprises a first electric layer, a seed metal layer and a second electric layer, so as to form a plurality of protrusions corresponding to the first surface and the second surface respectively, wherein the first electric layer is formed on the first surface and covers the first opening and the second openings, the seed metal layer at lest covers the first opening and the second openings, and the second electric layer is formed on the seed metal layer.

The present invention further provides a method of making a hybrid carrier, the method comprising the steps of:

(a) providing a substrate, having a first electric layer, a dielectric layer and a middle electric layer in sequence, the dielectric layer having a first area and a second area, wherein the first area is at the central portion of the dielectric layer and the second area is around the first area;

(b) removing parts of the middle electric layer and the dielectric layer to form at least one first opening and a plurality of second openings at the first area and the second area respectively, to expose parts of the first electric layer;

(c) forming a seed metal layer, the seed metal layer covering the middle electric layer, the dielectric layer and the first electric layer;

(d) forming a second electric layer, the second electric layer having a first portion and a second portion on the first area and the second area respectively, to cover the seed metal layer in the first opening and the second openings, and exposing parts of the seed metal layer, wherein the second electric layer is substantially higher than the seed metal layer;

(e) removing the exposed seed metal layer and the middle electric layer thereunder; and (f) removing parts of the first electric layer correspondingly opposite the exposed seed metal layer.

The hybrid carrier of the present invention has a plurality of interconnection leads (portions of the central metal layer corresponding to the first opening and the second openings), so that a wire bondable semiconductor device or a flip chip die apparatus can be placed on the hybrid carrier, and is electrically connected to the protrusions corresponding to the first area and the second area. Also, it is easy to dispose a semiconductor device on the hybrid carrier and easy to electrically bond the hybrid carrier and the semiconductor device, for example, wire bonding. Therefore, the hybrid carrier and the method for making the same can be applied to an area array metal CSP easily, and the method of the present invention is simple, so the production cost can be reduced.

DETAILED DESCRIPTION OF THE INVENTION

Figure 1:
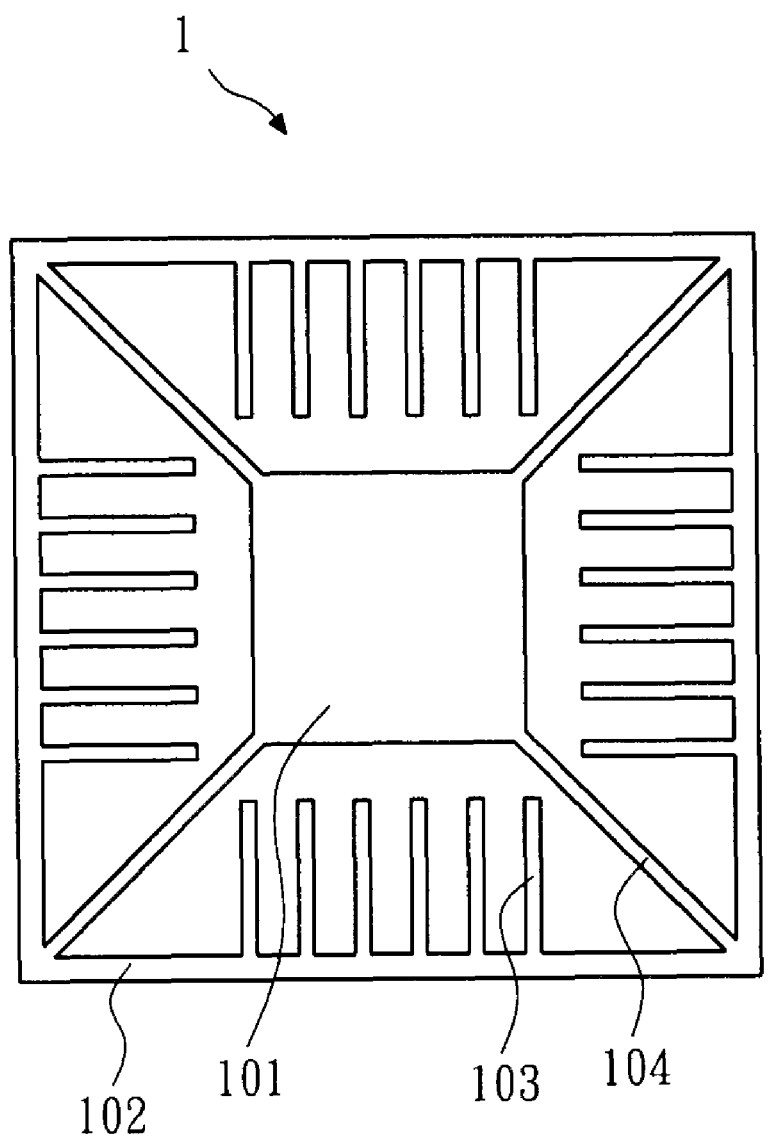
FIG. 1 shows a conventional leadframe.
Figure 2:
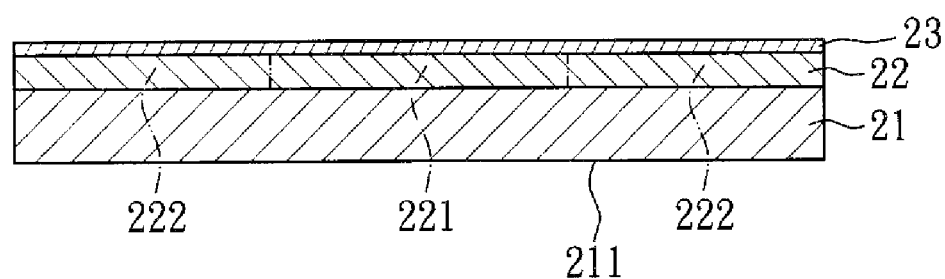
FIG. 2 shows a substrate of the present invention.

FIGS. 2 to 10 show a method for making a hybrid carrier according to the present invention. Firstly, referring to FIG. 2, a substrate 2 is provided. The substrate 2 has a first electric layer 21, a dielectric layer 22 and a middle electric layer 23 in sequence. The first electric layer 21 has a first surface 211. The dielectric layer 22 has a first area 221 and a second area 222, wherein the first area 221 is at the central portion of the dielectric layer 22 and the second area 222 is around the first area 221. In this embodiment, the substrate 2 is manufactured by the first electric layer 21 and a laminated substrate, wherein the laminated substrate comprises the dielectric layer 22 and a middle electric layer 23.

Figure 3:
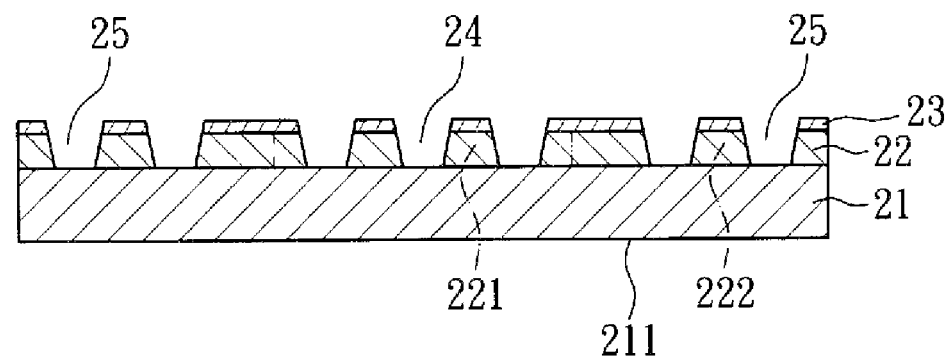
FIG. 3 shows a cross-sectional side view illustrating a step of forming a plurality of first openings and a plurality of second openings according to the present invention.

Referring to FIG. 3, parts of the middle electric layer 23 and the dielectric layer 22 are removed to form a plurality of first openings 24 and a plurality of second openings 25 at the first area 221 and the second area 222 respectively, to expose parts of the first electric layer 21. In this embodiment, it is noted that an etching method or a laser drilling method can be used to remove the parts of the middle electric layer 23 and the dielectric layer 22. In other applications, only one first opening 24 is formed, which is not shown here.

Figure 4:
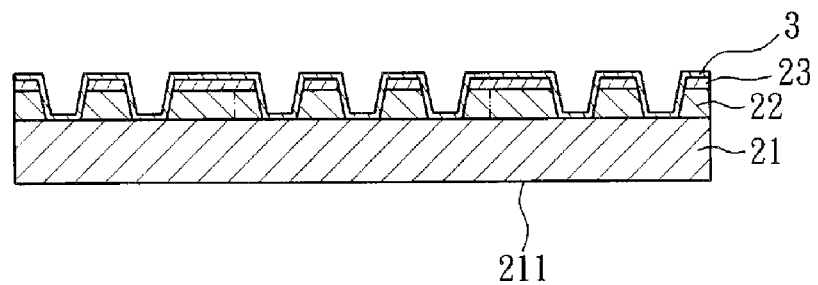
FIG. 4 shows a cross-sectional side view illustrating a step of forming a seed metal layer according to the present invention.

Referring to FIG. 4, a seed metal layer 3 is formed to cover the middle electric layer 23, the dielectric layer 22 and the first electric layer 21. In this embodiment, the seed metal layer 3 is formed by sputtering. In other applications, the seed metal layer 3 can also be formed by other methods that are familiar to those of ordinary skill in the art, for example, electroless plating.

Figure 5:
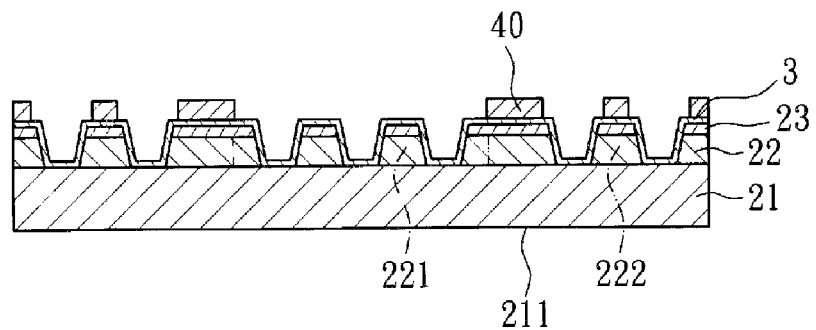
FIGS. 5 to 7 show cross-sectional side views illustrating the steps of forming a second electric layer according to the present invention.
Figure 6:
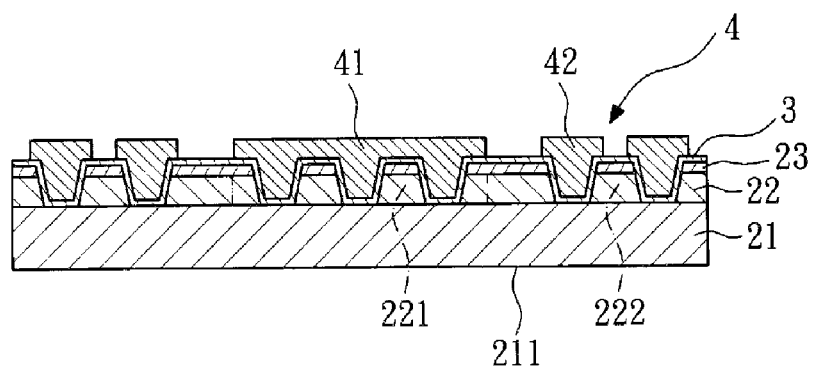

Referring to FIGS. 5 and 6, a second electric layer 4 is formed. The second electric layer 4 has a first portion 41 and a second portion 42 on the first area 221 and the second area 222 respectively, to cover the seed metal layer 3 in the first openings 24 and the second openings 25 (FIG. 3), and exposes parts of the seed metal layer 3 correspondingly on the second area 222. The second electric layer 4 is preferably substantially higher than the seed metal layer 3. In this embodiment, the second electric layer 4 is formed by the following process. Referring to FIGS. 5 and 6, a first dry film 40 is disposed on the seed metal layer 3 to define areas of the first portion 41 and the second portion 42. The second electric layer 4 is formed to cover the seed metal layer 3 so as to form the first portion 41 and the second portion 42, and the first dry film 40 is then removed to expose the parts of the seed metal layer 3 not covered by the second electric layer 4. The second electric layer 4 is preferably formed by plating.

Figure 7:
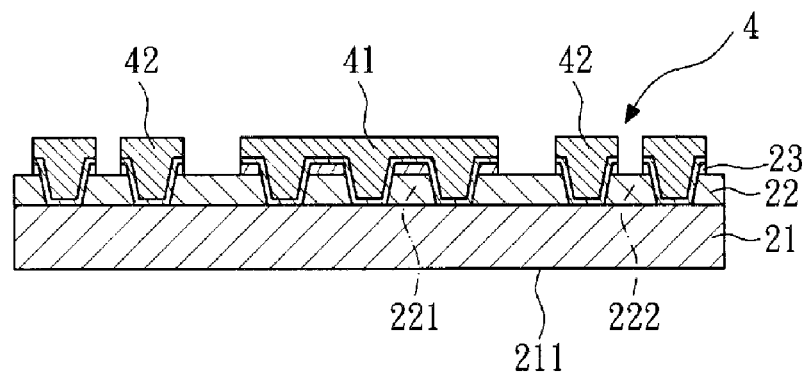

Referring to FIG. 7, the exposed seed metal layer 3 and the middle electric layer 23 thereunder are removed to expose parts of the dielectric layer 22. In this embodiment, the exposed seed metal layer 3 and the middle electric layer 23 are removed by etching.

It is noted that, the second electric layer 4 on the second portion 42 could only cover the seed metal layer 3 in the second openings 25 (formed by a laser drilling method, so that each second opening 25 will has a sidewall substantially perpendicular to the seed metal layer 3), which depends on the dry film define area, and the middle electric layer 23 on the second portion 42 may be totally removed (not shown). In other applications, only one first opening 24 formed on the first portion 41, what can be easily understand that the second electric layer 4 on the first portion 41 could only cover the seed metal layer 3 in the first opening 24, and the middle electric layer 23 on the first portion 41 may be totally removed.

Figure 8:
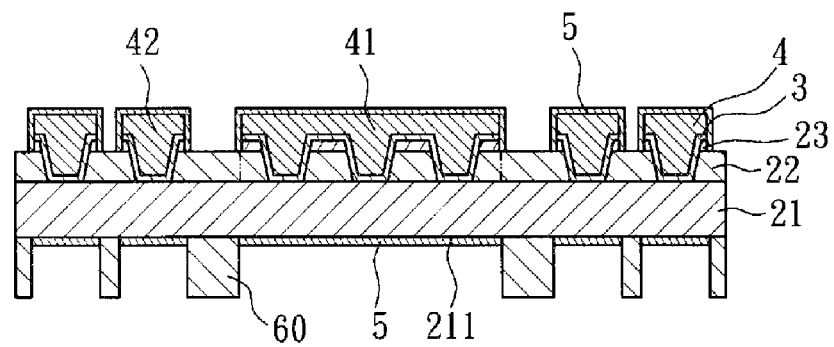
FIGS. 8 to 10 show cross-sectional side views illustrating the steps of forming a resist layer according to the present invention.
Figure 9:
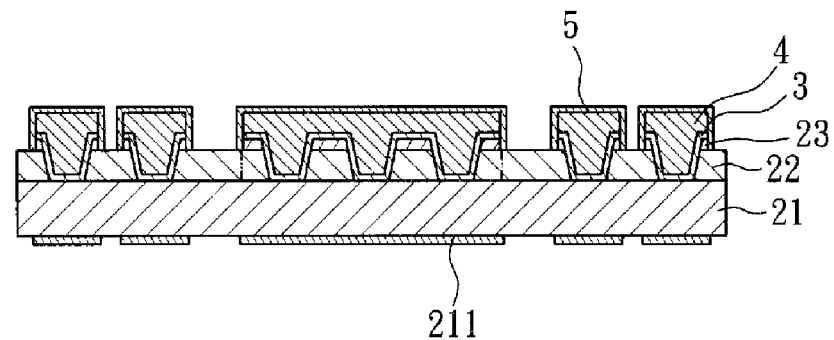

Referring to FIGS. 8 and 9, a resist layer 5 is formed. The resist layer 5 covers the second electric layer 4, the seed metal layer 3 and the middle electric layer 23, and covers parts of the first surface 211 of the first electric layer 21 corresponding to the first portion 41 and the second portion 42. In this embodiment, the resist layer 5 is formed by the following process. A second dry film 60 is disposed on parts of the first surface 211 of the first electric layer 21 correspondingly opposite the exposed seed metal layer 3. The resist layer 5 is formed, and the second dry film 60 is then removed. The resist layer 5 is preferably formed by plating.

Figure 10:
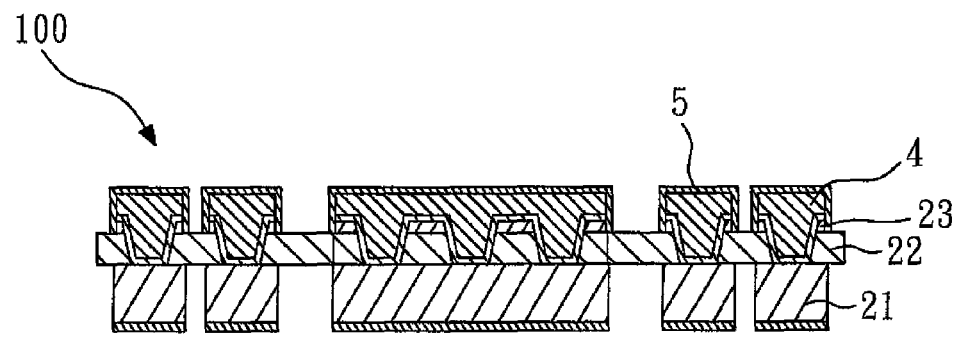

Referring to FIG. 10, the uncovered portion of first electric layer 21 by the resist layer 5 is removed to expose parts of the dielectric layer 22, so as to form a hybrid carrier 100 of the invention. In this embodiment, the uncovered first electric layer 21 is removed by alkali etching.

Figure 11:
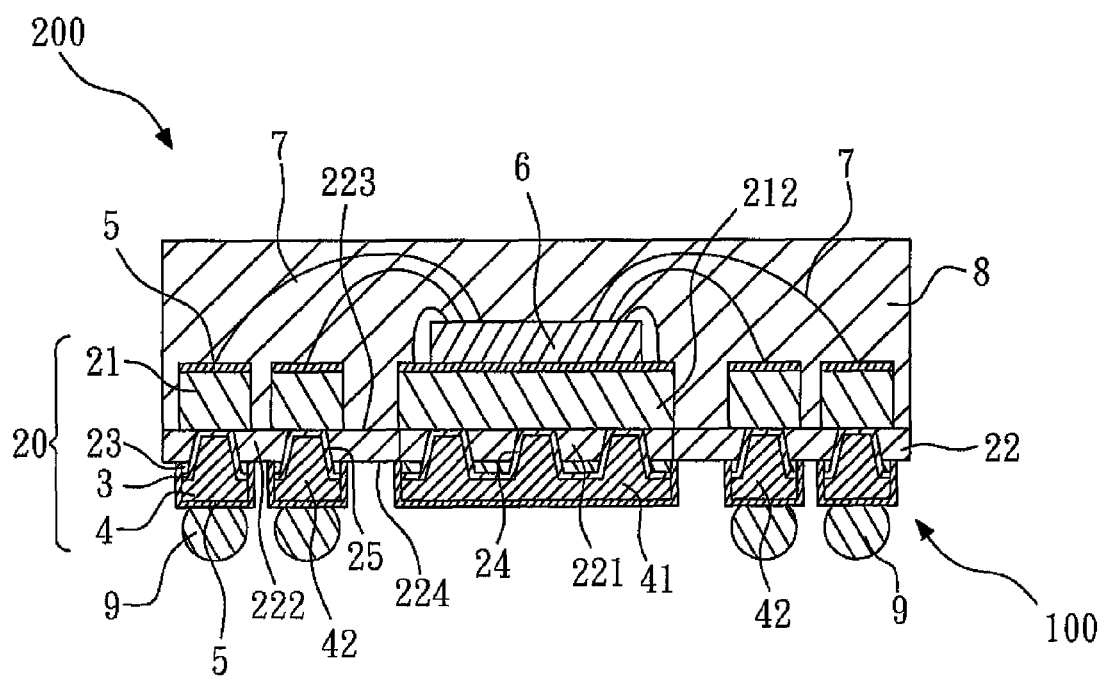
FIG. 11 shows a semiconductor package with the hybrid carrier of the present invention.

Referring to FIG. 11, it is noted that firstly, a semiconductor device 6 could be disposed on the resist layer 5 by the side of the first electric layer 21 and corresponds to the first portion 41 after the step of removing the uncovered first electric layer 21; secondly, a plurality of conductors 7 (for example, wires) are then used to electrically connect the semiconductor device 6 and the resist layer 5 corresponding to the second portion 42 by the side of the first electric layer 21, and finally, an encapsulating material 8 is used to encapsulate the resist layer 5, the conductors 7, the semiconductor device 6, the dielectric layer 22 and the first electric layer 21. Thus, a semiconductor package 200 is performed. In other applications, the semiconductor device 6 can also be electrically connected to the hybrid carrier 100 by a flip chip semiconductor device method (not shown). For various applications, a plurality of conducting bumps 9 could be disposed on the resist layer 5 covering the second electric layer 4 corresponding to the second portion 42.

Again, FIG. 11 shows a semiconductor package 200 with the hybrid carrier 100 of the present invention. The hybrid carrier 100 comprises a dielectric layer 22, a central metal layer 20 and a resist layer 5. The dielectric layer 22 has a first area 221, a second area 222, a first surface 223 and a second surface 224, wherein the second surface 224 corresponds to the first surface 223, the first area 221 is at the central portion of the dielectric layer 22 and the second area 222 is around the first area 221, the first area 221 has a plurality of first openings 24 and the second area 222 has a plurality of second openings 25. In other applications, only one first opening 24 is formed, which is not shown here.

In this embodiment, the area of projection of each first opening 24 on the first surface 223 is larger than that on the second surface 224; or the area of projection of at least one of the second openings 25 on the first surface 223 is larger than that on the second surface 224. Thus, the central metal layer 20 can be fixed to the dielectric layer 22 more steadily.

The central metal layer 20 covers the first openings 24 and the second openings 25, and exposes parts of the dielectric layer 22 corresponding to the second area 222 by both sides of the first surface 223 and the second surface 224, so as to form a plurality of protrusions corresponding to the first surface 223 and the second surface 224 respectively.

In this embodiment, the central metal layer 20 comprises a first electric layer 21, a seed metal layer 3, a middle electric layer 23 and a second electric layer 4, wherein the first electric layer 21 is formed on the first surface and covers the first openings 24 and the second openings 25. In this embodiment, the first electric layer 21 is disposed on the dielectric layer 22 by the side of the first surface 223, and the middle electric layer 23 is disposed on the dielectric layer 22 and between the dielectric layer and the seed metal layer 3 by the side of the second surface 224. The seed metal layer 3 at least covers the first openings 24 and the second openings 25. In this embodiment, the seed metal layer 3 is formed on the first openings 24 and the second openings 25, and covers the middle electric layer 23. The second electric layer 4 is formed on the seed metal layer 3. The first electric layer 21 and the middle electric layer 23 are preferably copper or copper alloy.

The resist layer 5 is formed on the second electric layer 4 and on the first electric layer 21. The resist layer 5 is preferably an Ni/Au layer. It is noted that, in this embodiment, the protrusion 212 of the first electric layer 21 corresponding to the first area 221 by the side of the first surface 223 comprises a die pad. In other applications, the protrusion 212 of the first electric layer 21 corresponding to the first area 221 by the side of the first surface 223 could further comprise a die pad and at least ground pad.

A semiconductor device 6 is disposed on the resist layer 5 corresponding to the protrusion 212 (the die pad) by the side of the first surface 223. A plurality of conductors 7 (for example, wires) are used to electrically connect the semiconductor device 6 and the resist layer 5 corresponding to second openings 25 by the side of the first surface 223. An encapsulating material 8 is used to encapsulate the resist layer 5, the conductors 7, the semiconductor device 6, the dielectric layer 22 and the first electric layer 21 by the side of the first surface 223. In addition, a plurality of conducting bumps 9 could be disposed on the resist layer 5 corresponding to the second area 222 by the side of the second surface 224.

The hybrid carrier 100 of the present invention has a plurality of interconnection leads (portions of the central metal layer 20 corresponding to the first openings 24 and the second openings 25), so that a wire bondable semiconductor device or a flip chip die apparatus can be placed on the die paddle of the hybrid carrier 100, and is electrically connected to the resist layer 5 corresponding to the first portion 41 and the second portion 42. Also, it is easy to dispose a semiconductor device on the die pad of the hybrid carrier 100 and easy to electrically bond the hybrid carrier 100 and the semiconductor device, for example, wire bonding or flip chip bonding.

In addition, the encapsulating material 8 could be used to encapsulate the wire bonds and to isolate each bond finger (the first electric layer 21 and the resist layer 5 corresponding to the second portion 42 by the side of the first surface 223). Furthermore, a ball grid array (the conducting bumps 9) could be disposed on the resist layer 5 corresponding to the second area 222 by the side of the second surface 224, so as to connects to an outer device. Therefore, the hybrid carrier 100 and the method for making the same can be applied to an area array metal CSP easily, and the method of the present invention is simple, so the production cost can be reduced.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A method for making a hybrid carrier, the method comprising the steps of:
   (a) providing a substrate, having a first electric layer, a dielectric layer and a middle electric layer in sequence, the dielectric layer having a first area and a second area, wherein the first area is at a central portion of the dielectric layer and the second area is around the first area;
   (b) removing parts of the middle electric layer and the dielectric layer to form at least one first opening and a plurality of second openings at the first area and the second area respectively, that do not extend through the first electric layer, to expose parts of the first electric layer;
   (c) forming a seed metal layer, the seed metal layer covering the middle electric layer, the dielectric layer and the first electric layer;
   (d) forming a second electric layer, the second electric layer having a first portion and a second portion on the first area and the second area respectively, to cover the seed metal layer in the first opening and the second openings, and exposing parts of the seed metal layer, wherein the second electric layer is substantially higher than the seed metal layer;
   (e) removing the exposed seed metal layer and the middle electric layer thereunder; and
   (f) removing parts of the first electric layer correspondingly opposite the exposed seed metal layer,
   wherein step (f) comprises the steps of
   (f1) disposing a second dry film on parts of a first surface of the first electric layer correspondingly opposite the exposed seed metal layer,
   (f2) forming a resist layer to cover the second electric layer, and to cover parts of the first surface of the first electric layer corresponding to the first portion and the second portion,
   (f3) removing the second dry film to expose the parts of the first surface of the first electric layer correspondingly opposite the exposed seed metal layer, and
   (f4) removing the parts of the first electric layer correspondingly opposite the exposed seed metal layer.

2. The method according to claim 1, wherein the substrate is manufactured by the first electric layer and a laminated substrate in step (a), wherein the laminated substrate comprises the dielectric layer and the middle electric layer.

3. The method according to claim 1, wherein an etching method or a laser drilling method can be used to remove parts of the middle electric layer and the dielectric layer in step (b).

4. The method according to claim 1, wherein the seed metal layer is formed by sputtering or electroless plating in step (c).

5. The method according to claim 1, wherein step (d) comprises the steps of:
   (d1) disposing a first dry film on the seed metal layer to define areas of the first portion and the second portion;
   (d2) forming the second electric layer to cover the seed metal layer; and
   (d3) removing the first dry film to expose parts of the seed metal layer not covered by the second electric layer.

6. The method according to claim 5, wherein the second electric layer is formed by plating in step (d2).

7. The method according to claim 1, wherein the exposed seed metal layer and the middle electric layer are removed by etching in step (e).

8. The method according to claim 1, wherein the parts of first electric layer is removed by alkali etching in step (f).

9. The method according to claim 1, further comprising the following steps after step (f):
   (g) disposing a semiconductor device on the resist layer by the side of the first electric layer;
   (h) by the side of the first electric layer, electrically connecting the semiconductor device to the resist layer which corresponds to the second portion;
   (i) encapsulating the resist layer, the semiconductor device, the dielectric layer and the first electric layer by using an encapsulating material; and
   (j) disposing a plurality of conducting bumps on the resist layer covering the second electric layer.

10. A method for making a hybrid carrier, the method comprising the steps of:
    (a) providing a substrate, having a first electric layer, a dielectric layer and a middle electric layer in sequence, the dielectric layer having a first area and a second area, wherein the first area is at a central portion of the dielectric layer and the second area is around the first area;
    (b) removing parts of the middle electric layer and the dielectric layer to form at least one first opening and a plurality of second openings at the first area and the second area respectively, to expose parts of the first electric layer;
    (c) forming a seed metal layer, the seed metal layer covering the middle electric layer, the dielectric layer and the first electric layer;
    (d) forming a second electric layer, the second electric layer having a first portion and a second portion on the first area and the second area respectively, to cover the seed metal layer in the first opening and the second openings, and exposing parts of the seed metal layer, wherein the second electric layer is substantially higher than the seed metal layer;
    (e) removing the exposed seed metal layer and the middle electric layer thereunder; and
    (f) removing parts of the first electric layer correspondingly opposite the exposed seed metal layer, wherein step (f) comprises the steps of
(f1) disposing a second dry film on parts of a first surface of the first electric layer correspondingly opposite the exposed seed metal layer,
(f2) forming a resist layer to cover the second electric layer, and to cover parts of the first surface of the first electric layer corresponding to the first portion and the second portion,
(f3) removing the second dry film to expose the parts of the first surface of the first electric layer correspondingly opposite the exposed seed metal layer, and
(f4) removing the parts of the first electric layer correspondingly opposite the exposed seed metal layer.

11. The method according to claim 10, wherein the substrate is manufactured by the first electric layer and a laminated substrate in step (a), wherein the laminated substrate comprises the dielectric layer and the middle electric layer.

12. The method according to claim 10, wherein an etching method or a laser drilling method can be used to remove parts of the middle electric layer and the dielectric layer in step (b).

13. The method according to claim 10, wherein the seed metal layer is formed by sputtering or electroless plating in step (c).

14. The method according to claim 10, wherein step (d) comprises the steps of:
(d1) disposing a first dry film on the seed metal layer to define areas of the first portion and the second portion;
(d2) forming the second electric layer to cover the seed metal layer; and
(d3) removing the first dry film to expose parts of the seed metal layer not covered by the second electric layer.

15. The method according to claim 14, wherein the second electric layer is formed by plating in step (d2).

16. The method according to claim 10, wherein the exposed seed metal layer and the middle electric layer are removed by etching in step (e).

17. The method according to claim 10, wherein the parts of first electric layer is removed by alkali etching in step (f).

18. A method for making a hybrid carrier, the method comprising the steps of:
(a) providing a substrate, having a first electric layer, a dielectric layer and a middle electric layer in sequence, the dielectric layer having a first area and a second area, wherein the first area is at a central portion of the dielectric layer and the second area is around the first area;
(b) removing parts of the middle electric layer and the dielectric layer to form at least one first opening and a plurality of second openings at the first area and the second area respectively, to expose parts of the first electric layer;
(c) forming a seed metal layer, the seed metal layer covering the middle electric layer, the dielectric layer and the first electric layer;
(d) forming a second electric layer, the second electric layer having a first portion and a second portion on the first area and the second area respectively, to cover the seed metal layer in the first opening and the second openings, and exposing parts of the seed metal layer, wherein the second electric layer is substantially higher than the seed metal layer;
(e) removing the exposed seed metal layer and the middle electric layer thereunder;
(f) removing parts of the first electric layer correspondingly opposite the exposed seed metal layer;
(g) disposing a semiconductor device on the resist layer by the side of the first electric layer;
(h) by the side of the first electric layer, electrically connecting the semiconductor device to the resist layer which corresponds to the second portion;
(i) encapsulating the resist layer, the semiconductor device, the dielectric layer and the first electric layer by using an encapsulating material; and
(j) disposing a plurality of conducting bumps on the resist layer covering the second electric layer,
wherein step (f) comprises the steps of
(f1) disposing a second dry film on parts of a first surface of the first electric layer correspondingly opposite the exposed seed metal layer,
(f2) forming a resist layer to cover the second electric layer, and to cover parts of the first surface of the first electric layer corresponding to the first portion and the second portion,
(f3) removing the second dry film to expose the parts of the first surface of the first electric layer correspondingly opposite the exposed seed metal layer, and
(f4) removing the parts of the first electric layer correspondingly opposite the exposed seed metal layer.

19. The method according to claim 18, wherein the substrate is manufactured by the first electric layer and a laminated substrate in step (a), wherein the laminated substrate comprises the dielectric layer and the middle electric layer.

20. The method according to claim 18, wherein an etching method or a laser drilling method can be used to remove parts of the middle electric layer and the dielectric layer in step (b).

21. The method according to claim 18, wherein the seed metal layer is formed by sputtering or electroless plating in step (c).

22. The method according to claim 18, wherein step (d) comprises the steps of:
(d1) disposing a first dry film on the seed metal layer to define areas of the first portion and the second portion;
(d2) forming the second electric layer to cover the seed metal layer; and
(d3) removing the first dry film to expose parts of the seed metal layer not covered by the second electric layer.

23. The method according to claim 22, wherein the second electric layer is formed by plating in step (d2).

24. The method according to claim 18, wherein the exposed seed metal layer and the middle electric layer are removed by etching in step (e).

25. The method according to claim 18, wherein the parts of first electric layer is removed by alkali etching in step (f).

* * * * *